United States Patent
Yang et al.

(10) Patent No.: US 12,022,650 B2
(45) Date of Patent: Jun. 25, 2024

(54) LOW RESISTIVITY DRAM BURIED WORD LINE STACK

(71) Applicant: Applied Materials, Inc., Santa Clara, CA (US)

(72) Inventors: Yixiong Yang, Fremont, CA (US); Jacqueline S. Wrench, San Jose, CA (US); Yong Yang, Boston, MA (US); Srinivas Gandikota, Santa Clara, CA (US); Annamalai Lakshmanan, Fremont, CA (US); Joung Joo Lee, San Jose, CA (US); Feihu Wang, San Jose, CA (US); Seshadri Ganguli, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/149,226

(22) Filed: Jan. 3, 2023

(65) Prior Publication Data

US 2023/0141748 A1    May 11, 2023

Related U.S. Application Data

(63) Continuation of application No. 17/335,287, filed on Jun. 1, 2021, now Pat. No. 11,587,936.

(Continued)

(51) Int. Cl.
*H10B 12/00*     (2023.01)
*C23C 16/455*    (2006.01)
(Continued)

(52) U.S. Cl.
CPC ..... *H10B 12/488* (2023.02); *C23C 16/45553* (2013.01); *H01L 21/02491* (2013.01); *H01L 21/02631* (2013.01); *H01L 21/2855* (2013.01); *H01L 21/28556* (2013.01); *H01L 21/28568* (2013.01); *H01L 21/823431* (2013.01); *H01L 21/823475* (2013.01)

(58) Field of Classification Search
CPC .................. H01L 21/28556; H10B 12/488
See application file for complete search history.

(56) References Cited

U.S. PATENT DOCUMENTS 10,573,522 B2    2/2020  Jandl et al.
10,790,287 B2    9/2020  Kang et al.
(Continued)

FOREIGN PATENT DOCUMENTS

CN    110875391 A    3/2020
KR    20180019487 A    2/2018
(Continued)

OTHER PUBLICATIONS

PCT International Search Report and Written Opinion in PCT/US2022/017798 dated Jun. 13, 2022, 9 pages.
(Continued)

*Primary Examiner* — John A Bodnar
(74) *Attorney, Agent, or Firm* — Servilla Whitney LLC

(57) ABSTRACT

Methods for DRAM device with a buried word line are described. The method includes forming a metal cap layer and a molybdenum conductor layer in a feature on a substrate. The method includes depositing the metal cap layer on the substrate by physical vapor deposition (PVD) and depositing the molybdenum conductor layer by atomic layer deposition (ALD) on the metal cap layer.

20 Claims, 3 Drawing Sheets

Related U.S. Application Data

(60) Provisional application No. 63/154,589, filed on Feb. 26, 2021.

(51) Int. Cl.
   H01L 21/02 (2006.01)
   H01L 21/285 (2006.01)
   H01L 21/8234 (2006.01)

(56) References Cited

U.S. PATENT DOCUMENTS

| | | |
|---|---|---|
| 10,833,087 B2 | 11/2020 | Fishburn et al. |
| 2008/0258133 A1 | 10/2008 | Seong |
| 2013/0234240 A1 | 9/2013 | Moon et al. |
| 2018/0358362 A1 | 12/2018 | Yen et al. |
| 2019/0057895 A1 | 2/2019 | Chen et al. |
| 2019/0067094 A1 | 2/2019 | Zope et al. |
| 2019/0341302 A1 | 11/2019 | Lei et al. |
| 2020/0286897 A1 | 9/2020 | Panda et al. |
| 2022/0277961 A1 | 9/2022 | Lakshmanan et al. |

FOREIGN PATENT DOCUMENTS

| | | |
|---|---|---|
| KR | 20200090088 A | 7/2020 |
| WO | 2020106649 A1 | 5/2020 |
| WO | 2020185618 A1 | 9/2020 |

OTHER PUBLICATIONS

PCT International Search Report and Written Opinion in PCT/US2022/017912 dated Jun. 9, 2022, 11 pages.

Anitha, et al., "Deposition of molybdenum nitride thin films by r.f. reactive magnetron sputtering", Surface and Coatings Technology 79 (1996), 50-54. (Year: 1996).

Wolfgang, et al., "Influence of the deposition parameters on the texture and mechanical properties of magnetron sputtered cubic MoNxthin films", Materialia (2019). (Year: 2019).

LOW RESISTIVITY DRAM BURIED WORD LINE STACK

CROSS-REFERENCE TO RELATED APPLICATIONS

This application is a Continuation of U.S. application Ser. No. 17/335,287, filed Jun. 1, 2021, which claims priority to U.S. Provisional Application Ser. No. 63/154,589, filed Feb. 26, 2021, the entire disclosures of which are hereby incorporated by reference herein.

TECHNICAL FIELD

Embodiments of the disclosure pertain to the field of semiconductor devices and semiconductor device manufacturing. More particularly, embodiments of the disclosure are directed to methods comprising depositing a metal cap layer on a substrate and depositing a molybdenum conductor layer on the metal cap layer.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suite for use in electronic devices. Dynamic random-access memories (DRAMs) can be programmed to store a voltage which represents one of two binary values but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

In manufacturing, DRAM word lines are made of atomic layer deposition of titanium nitride (TiN) and tungsten (W) stacks. These stacks have scaling issues due to the further shrinking of buried word line dimensions. Therefore, there is a need in the art for metal stacks demonstrating low resistivity in buried word line manufacture.

SUMMARY

One or more embodiments of the disclosure are directed to methods of forming a buried word line. In some embodiments, the method comprises depositing a metal cap layer on a substrate by physical vapor deposition (PVD), the substrate comprising at least one feature and the featuring have one or more of a gate oxide layer and a work-function metal layer deposited thereon; and depositing a molybdenum conductor layer by atomic layer deposition (ALD) on the metal cap layer.

Another aspect of the disclosure is directed to methods of forming a DRAM buried word line having a resistance in a range of from 10 µΩ-cm to 20 µΩ-cm. In one or more embodiments, the method comprises depositing a metal cap layer on a substrate by DC physical vapor deposition (PVD), wherein the substrate is exposed to a metal precursor comprising tungsten at a direct current of 35 kW, a bias of 1160 W, and depositing a molybdenum conductor layer by a thermal atomic layer deposition on the metal cap layer, wherein the metal cap layer is exposed to the molybdenum precursor. In one or more embodiments, the method comprises depositing a metal cap layer on a substrate by RF physical vapor deposition (PVD), wherein the substrate is exposed to a metal precursor comprising tungsten at a radio frequency of 3 kW, a bias of 50 W, and a pressure of 230 mTorr, and depositing a molybdenum conductor layer by a thermal atomic layer deposition on the metal cap layer, wherein the metal cap layer is exposed to the molybdenum precursor. In one or more embodiments, the method comprises depositing a metal cap layer on a substrate by RF physical vapor deposition (PVD), wherein the substrate is exposed to a metal precursor comprising molybdenum at a radio frequency of 3 kW, a bias of 50 W and a pressure of 100 mTorr, and depositing a molybdenum conductor layer by a thermal atomic layer deposition on the metal cap layer, wherein the metal cap layer is exposed to the molybdenum precursor.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1:
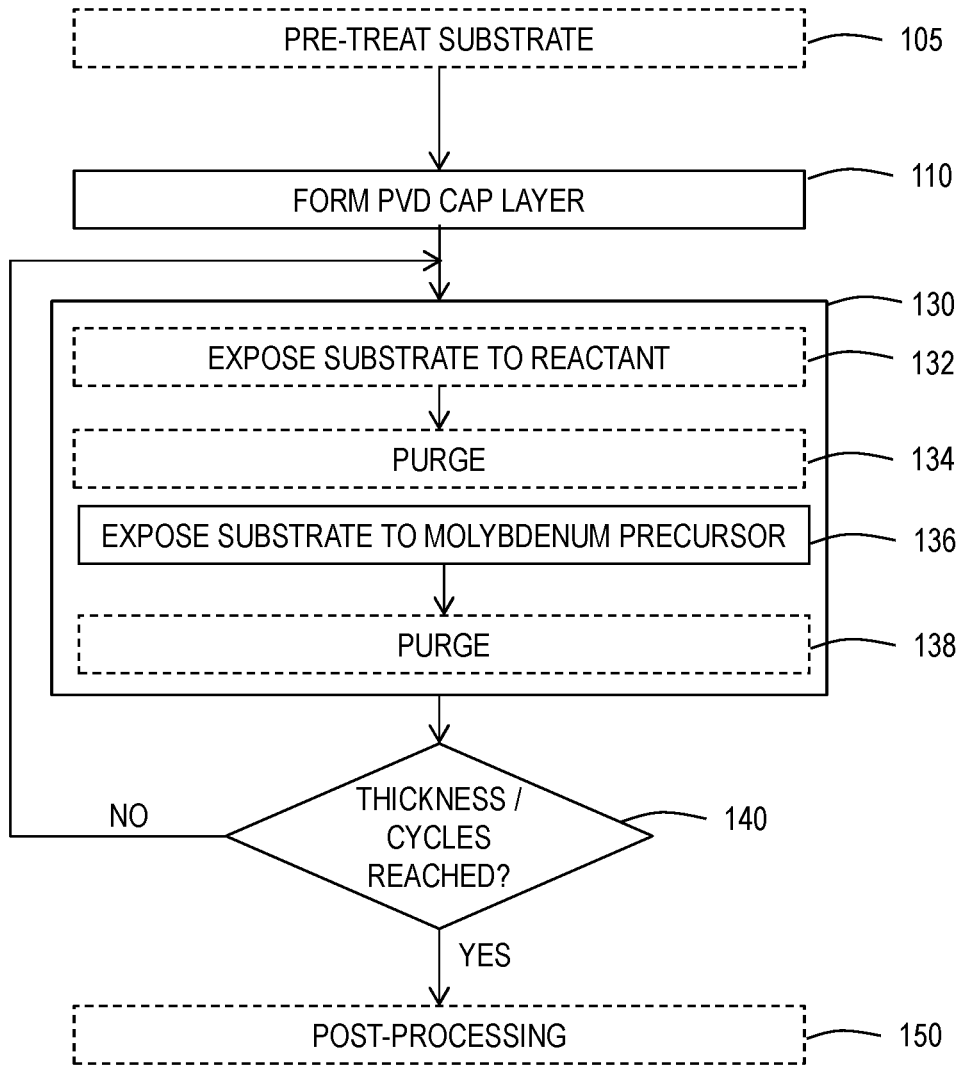
FIG. 1 illustrates a process flow diagram of a method in accordance with one or more embodiments of the disclosure.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., aluminum precursor) is pulsed into the reaction zone followed by a first time delay. Next, a second precursor or compound B (e.g., oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

As used herein throughout the specification, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the purging the substrate surface or the reaction chamber may occur for a time duration in a range of from 0.2 seconds to 30 seconds, from 0.2 seconds to 10 seconds, from 0.2 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells. The rows on access transistors are linked by word lines, and the transistor inputs/outputs are linked by bit lines. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate. Current DRAM buried word line (bWL) processes involve titanium nitride (TiN) and tungsten (W) stacks. With further scaling of the bWL dimensions, one focus is removing the titanium nitride barrier from the stacks to form barrierless metal fills in trench structures. Due to the poor adhesion between metal and trench structures, however, voiding and delamination of the metal fill is often observed during high-temperature post anneal treatments. Such voids and delamination are undesired because it will cause problems for subsequent planarization or etching processes. Voids and delamination also contribute to an increase in stack resistance. Accordingly, embodiments of the present disclosure relate provide processes for making a stack in a DRAM buried word line (bWL) on a substrate which advantageously reduces resistance in the DRAM device. Resistance is reduced by eliminating nitrogen-based layers, e.g., a nitride cap layer and/or a nitride liner layer.

Traditionally, DRAM cells have recessed high workfunction metal structures in buried word line structure. In a DRAM device, a bit line is formed in a metal level situated above the substrate, while the word line is formed at the polysilicon gate level at the surface of the substrate. In a buried word line (bWL) device, a word line is buried below the surface of a semiconductor substrate using a metal as a gate electrode.

The selection of metal to be used as a gate electrode can greatly impact the performance of the device. Without intending to be bound by theory, it is believed that the use of low melting point metals with low resistance advantageously provides bWL DRAM with reduced resistance. When exposed to the thermal process requirements used in manufacturing bWL DRAM, however, these materials are often found to delaminate from the surface. The delamination can impact final array resistance and cause reliability issues.

In one or more embodiments, a resistance (μΩ-cm) is measured for the buried word line having a total thickness of 100 Å. In one or more embodiments, the buried word line has a resistance less than or equal to 40 μΩ-cm, less than or equal to 30 μΩ-cm, less than or equal to 25 μΩ-cm, less than or equal to 20 μΩ-cm, or less than or equal to 15 μΩ-cm at a total thickness of 100 Å. In some embodiments, the buried word line has resistance less than or equal to 20 μΩ-cm at a total thickness of 100 Å. In one or more embodiments, the buried word line formed by the method 100 has a resistance in a range of from 50 μΩ-cm to 5μΩ-cm, from 40 μΩ-cm to 10 μΩ-cm, from 30 μΩ-cm to 10 μΩ-cm, from 25 μΩ-cm to 10 μΩ-cm, from 20 μΩ-cm to 10 μΩ-cm at a total thickness of 100 Å.

FIG. 1 illustrates a process flow diagram of a method according to one or more embodiments of the present disclosure. FIGS. 2 through 8 are cross-sectional views illustrating a memory device 200 in various stages of processing to form a buried word line (bWL) according to one or more embodiments.

With reference to FIGS. 1 thru 8, one or more embodiments of the disclosure are directed to method 100 of forming a buried word line (bWL) 215 on a substrate surface 202.

Figure 2:
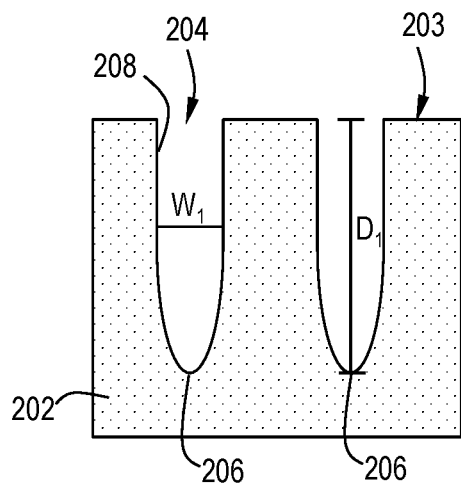
FIG. 2 is a cross-section view of a device according to one or more embodiments.

Referring to FIG. 2, a substrate 202 is provided having a plurality of trenches 204 therein. The trenches 204 form a recessed channel. The trenches have a bottom 206 and at least one sidewall 208. The plurality of trenches 204 may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the plurality of trenches 204 is defined by a distance Wi from one sidewall 208 to another sidewall 208. The plurality of trenches 204 may be formed so as to have a depth within a range of about 120 nm to about 250 nm, including, but not limited to a range of about 120 nm to about 150 nm, about 150 nm to about 200 nm, about 200 nm to about 250 nm, about 120 nm to about 200 nm, or about 150 nm to about 250 nm. As will be recognized by one of skill in the art, the depth of the plurality of trenches 204 is defined by the distance $D_1$ from the substrate surface 203 to the bottom 206 of the plurality of trenches 204.

One or more embodiments of the disclosure are directed to methods of depositing a film in high aspect ratio features. A high aspect ratio feature is a trench, via or pillar having a height: width ratio greater than or equal to about 10, 20, or 50, or more. In some embodiments, the film is deposited conformally on/in the high aspect ratio feature. As used in this manner, a conformal film has a thickness near the top of the feature that is in the range of about 80-120% of the thickness at the bottom of the feature.

In order to form the plurality of trenches 204, a buffer insulating layer (e.g., a silicon oxide layer, not illustrated) may be formed on the substrate surface 203, and/or a hard mask layer (e.g., a nitride layer, not illustrated) may be formed. Such techniques are well known to those skilled and the art, and, thus, are not illustrated.

Figure 3:
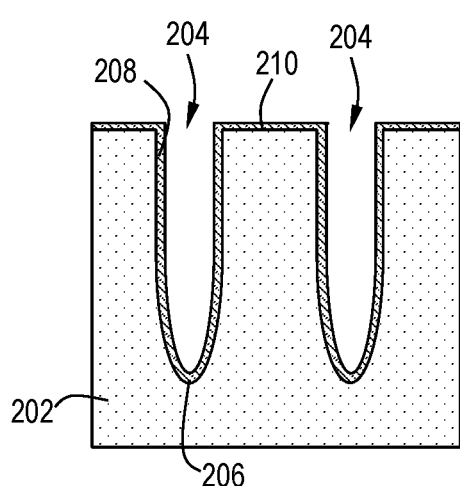
FIG. 3 is a cross-section view of a device according to one or more embodiments.

With reference to FIG. 3, a gate oxide layer 210 is conformally deposited on the substrate 202, on the substrate surface 203 and along the sidewall(s) 208 and bottom 206 of the plurality of trenches 204. In one or more embodiments, the gate oxide layer 210 comprises one or more of silicon oxynitride (SiON), silicon oxide, or a high-K dielectric material.

While the term "silicon oxide" may be used to describe the gate oxide layer 210, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, tungsten oxide, zirconium oxide, aluminum oxide, hafnium oxide, and the like.

In one or more embodiments, the term "high-K dielectric" refers to a material with a high dielectric constant (as compared to, e.g., silicon dioxide). In one or more embodiments, the high-K dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), or zirconium silicon oxide (ZrSiO).

In one or more embodiments, the gate oxide layer 210 has a thickness in a range of about 1 nm to about 7 nm, including about 1 nm, about 2 nm, about 3 nm, about 4 nm, about 5 nm, about 6 nm, or about 7 nm.

Figure 4:
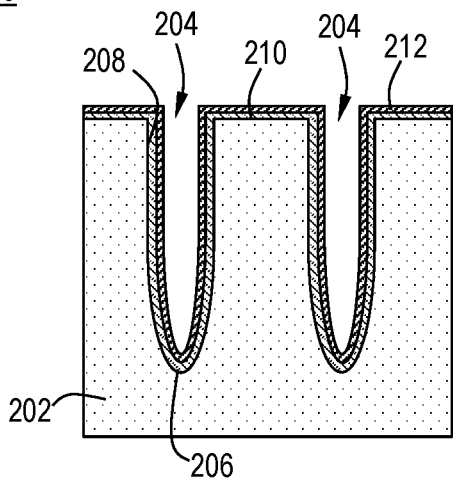
FIG. 4 is a cross-section view of a device according to one or more embodiments.

Referring to FIG. 4, in some embodiments, a work function metal layer 212 is formed on the gate oxide layer 210. As used herein, the term "work-function" refers to the bulk chemical potential of a material (e.g., metal) relative to the vacuum level. In one or more embodiments, the work-function metal layer has a work function greater than or equal to 4.3 eV. In some embodiments, the work-function metal layer 212 has a work function greater than or equal to 4.5 eV. In other embodiments, the work-function metal layer 212 has a work-function greater than or equal to 4.3 eV, including greater than or equal to 4.4 eV, greater than or equal to 4.5 eV, greater than or equal to 4.6 eV, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In one or more embodiments, the work-function metal layer 212 comprises a metal nitride. In one or more embodiments, the work-function metal layer 212 comprises one or more of titanium nitride (TiN), tungsten nitride (WN), tantalum nitride (TaN), molybdenum nitride (MoN), TaN/TiN, or WN/TiN. In one or more embodiments, the work-function metal layer 212 is selected from the group consisting of titanium nitride (TiN), tungsten nitride (WN), tantalum nitride (TaN), molybdenum nitride (MoN), TaN/TiN, WN/TiN, and combinations thereof. In one or more embodiments, the work-function metal layer 212 comprises titanium nitride.

In one or more embodiments, the work-function metal layer 212 has a thickness in a range of about 1 nm to about 5 nm, including about 1 nm, about 2 nm, about 3 nm, about 4 nm, or about 5 nm.

Referring to FIG. 1, in some embodiments, the method 100 includes an optional pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer. In some embodiments, the pre-treatment comprises polishing, etching, reduction, oxidation, halogenation, hydroxylation, annealing, baking, or the like.

Figure 5:
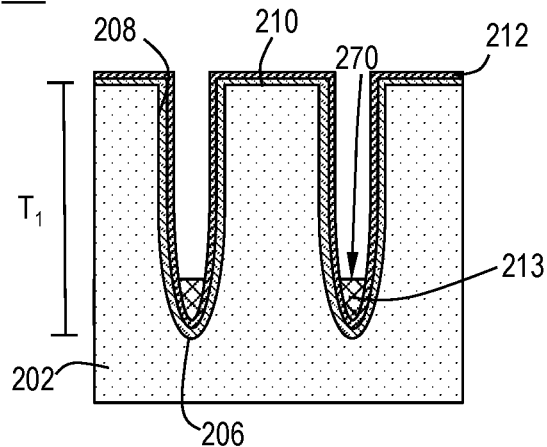
FIG. 5 is a cross-section view of a device according to one or more embodiments.

In some embodiments, the method 100 begins at deposition operation 110. Referring to FIGS. 1 and 5, at physical vapor deposition (PVD) operation 110, a process is performed to form a metal cap layer 213 in the plurality of trenches 204 on the gate oxide layer 210 and the work-function metal layer 212. The skilled artisan is familiar with PVD processing. In some embodiments, the metal cap layer 213 comprises tungsten or molybdenum containing species. FIG. 5 illustrates a metal cap layer 213 formed in the plurality of trenches 204 on the gate oxide layer 210. The metal cap layer 213 has a third surface 270 (or a top surface) facing the trench 204.

In some embodiments, the metal cap layer 213 is directly deposited on the gate oxide layer 210. In other embodiments, the metal cap layer 213 is directly deposited on the work-function metal layer 212.

In some embodiments, the physical vapor deposition (PVD) process comprises one or more of direct current (DC) or radio-frequency (RF) PVD. In some embodiments, the PVD process comprises RF and DC. In some embodiments, the DC is supplied to the substrate and the RF is supplied to the metal target. In one or more embodiments, the DC component has a power in a range of from 0 kilowatt (kW) to 100 kW, from 10 kW to 80 kW, from 20 kW to 60 kW, from 30 kW to 50 kW, from 40 kW to 50 kW. In one or more embodiments, radio frequency component has a power in range of from 1 kW to 10 kW, from 3 kW to 10 kW, from 5 kW to 10 kW, from 7 kW to 10 kW, from 1 kW to 7 kW, from 3 kW to 7 kW, from 5 kW to 7 kW, from 1 kW to 5 kW, from 3 kW to 5 kW, or from 1 kW to 3 kW.

In some embodiments, the PVD process comprises biasing the substrate to provide a directional deposition. In one or more embodiments, bias is in a range of from 0W to 1200 W, from 0 W to 1000 W, from 0 W to 800 W, from 0 W to 600 W, from 0 W to 400 W, from 0 W to 200 W, from 0 W to 1200 W, from 200 W to 1000 W, from 200 W to 800 W, from 200 W to 600 W, from 200 W to 400 W, from 400 W to 1200 W, from 400 W to 1000 W, from 400 W to 800 W, from 400 W to 600 W, from 600 W to 1200 W, from 600 W to 1000 W, from 600 W to 800 W, from 800 W to 1200 W, from 800 W to 1000 W or from 1000 W to 1200 W.

In some embodiments, the PVD process occurs at a temperature in a range of from 200° C. to 450° C., from 250° C. to 450° C., from 300° C. to 450° C., from 350° C. to 450° C., from 400° C. to 450° C., 200° C. to 400° C., from 250° C. to 400° C., from 300° C. to 400° C., from 350° C. to 400° C., 200° C. to 350° C., from 250° C. to 350° C., from 300° C. to 350° C., 200° C. to 300° C., from 250° C. to 300° C. or from 200° C. to 250° C.

In some embodiments, the PVD process occurs at a pressure in a range of from 0.5 mTorr to 500 mTorr, or in the range of 10 mTorr to 500 mTorr, or in the range of 25 mTorr to 250 mTorr, or in the range of 50 mTorr to 150 mTorr.

In some embodiments, the metal cap layer 213 comprises elemental metal. In some embodiments, the metal cap layer 213 consists essentially of metal. As used in this manner, the term "consists essentially of metal" means that the content of metal in the film is greater than or equal to about 80%, 85%, 90%, 95%, 98%, 99% or 99.5% metal, in atomic percent. Measurements of the composition of the metal cap layer 213 refer to the bulk portion of the metal cap layer 213, excluding interface regions where diffusion of elements from adjacent films may occur.

In some embodiments, the metal cap layer 213 is effective to inhibit and/or eliminate diffusion of undesirable elements into and/or silicon out of the underlying layer. In some embodiments, the metal cap layer 213 is deposited substantially only on the bottom 206 of the feature. As used in this manner, the term "substantially only" means that less than or equal to 5%, 2% or 1% of the metal cap layer forms on the sidewall of the feature.

In one or more embodiments, the metal cap layer 213 may have any suitable thickness. For example, the metal cap layer 213 may have a thickness in a range of from 10 Å to 200 Å, from 20 Å to 200 Å, from 50 Å to 200 Å, from 100 Å to 200 Å, from 150 Å to 200 Å, from 10 Å to 150 Å, from 50 Å to 150 Å, from 100 Å to 150 Å, from 10 Å to 100 Å, from 50 Å to 100 Å, from 10 Å to 50 Å or from 10 Å to 30 Å.

Figure 6:
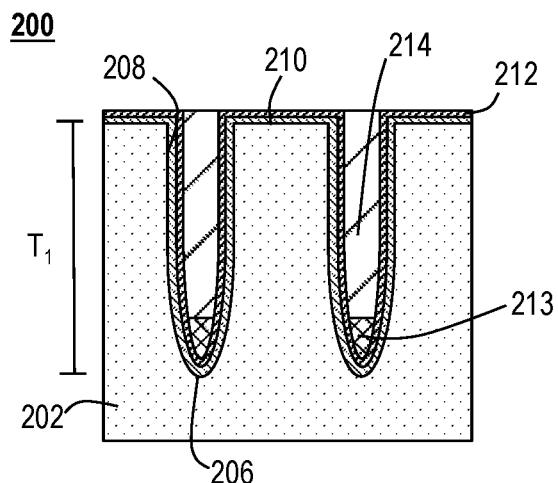
FIG. 6 is a cross-section view of a device according to one or more embodiments.

Once the predetermined thickness of the metal cap layer has been formed, the method 100 moves to an atomic layer deposition 130 process, as illustrated in FIG. 1. Referring to FIGS. 1 and 6, at deposition 130, a process is performed to deposit a molybdenum conductor layer 214 on the substrate 202 (substrate surface). The deposition process 130 can include one or more operations to form the molybdenum conductor layer 214 on the substrate 202. In some embodiments, the deposition process 130 is selective for deposition on the metal cap layer 213.

The atomic layer deposition 130 process of some embodiments comprises sequential exposures to a precursor and a reactant. At operation 132, the substrate 202 (or substrate surface) is optionally exposed to a reactant. In some embodiments, the third surface 270 is exposed to the reactant. In some embodiments, the reactant comprises a reducing agent. The reducing agent may be any suitable compound known to a skilled in the art. In some embodiments, the reducing agent comprises hydrogen ($H_2$).

In some embodiments, the substrate 202 (or substrate surface) is exposed to a reducing agent at a temperature in a range of from 350° C. to 550° C., from 400° C. to 550° C., from 450° C. to 550° C., 500° C. to 550° C., from 350° C. to 500° C., from 400° C. to 500° C., from 450° C. to 500° C., from 350° C. to 450° C., from 400° C. to 450° C. or from 350° C. to 400° C.

In some embodiments, the substrate 202 (or substrate surface) is exposed to a reducing agent for a duration of time in a range of from 5 seconds to 60 minutes, from 1 minutes to 60 minutes, from 5 minutes to 60 minutes, from 10 minutes to 60 minutes, from 20 minutes to 60 minutes, from 40 minutes to 60 minutes, from 5 seconds to 40 minutes, from 1 minutes to 40 minutes, from 5 minutes to 40 minutes, from 10 minutes to 40 minutes, from 20 minutes to 40 minutes, from 5 seconds to 20 minutes, from 1 minutes to 20 minutes, from 5 minutes to 20 minutes, from 10 minutes to 20 minutes, from 5 seconds to 10 minutes, from 1 minutes to 10 minutes or from 5 minutes to 10 min.

In some embodiments, the substrate 202 (or substrate surface) is exposed to a reducing agent at a dose in a range of from 100 sccm to 7000 sccm, from 500 sccm to 7000 sccm, from 1000 sccm to 7000 sccm, from 3000 sccm to 7000 sccm, from 5000 sccm to 7000 sccm, from 100 sccm to 5000 sccm, from 500 sccm to 5000 sccm, from 1000 sccm to 5000 sccm, from 3000 sccm to 5000 sccm, from 100 sccm to 3000 sccm, from 500 sccm to 3000 sccm, from 1000 sccm to 3000 sccm, from 100 sccm to 1000 sccm, from 500 sccm to 1000 sccm or from 100 sccm to 500 sccm.

In some embodiments, the substrate 202 (or substrate surface) is exposed to a reducing agent at a pressure in a range of from 5 Torr to 50 Torr, from 10 Torr to 50 Torr, from 25 Torr to 50 Torr, from 5 Torr to 25 Torr, from 10 Torr to 25 Torr or from 5 Torr to 10 Torr.

With reference to FIG. 1, at operation 134, the processing chamber is optionally purged to remove unreacted reactant, reaction products, and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the metal precursor by any suitable technique including, but not limited to, moving the substrate through a gas curtain to a portion or sector of the processing chamber that contains none or substantially none of the metal precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of argon (Ar), nitrogen ($N_2$), hydrogen ($H_2$), and helium (He).

With reference to FIGS. 1 and 6, in operation 136, the substrate 202 (or substrate surface) is exposed to a molybdenum precursor to deposit the molybdenum conductor layer 214 on the substrate 202 (or substrate surface). In operation 136, the substrate 202 (or substrate surface) is exposed to a molybdenum precursor to deposit the molybdenum conductor layer 214 on the metal cap layer 213. In operation 136, the substrate 202 (or substrate surface) is exposed to a molybdenum precursor to deposit the molybdenum conductor layer 214 on the reduced metal cap layer.

The molybdenum precursor can be any suitable molybdenum-containing compound that can react with (i.e., adsorb or chemisorb onto) the substrate surface to leave a molybdenum-containing species on the substrate surface.

FIG. 6 shows the molybdenum conductor layer 214 deposited on the metal cap layer 213. In some embodiments, the molybdenum conductor layer 214 comprises a molybdenum containing species. The molybdenum conductor layer 214 of some embodiments comprises a combination of layers to provide an active contact and/or a metal contact.

In some embodiments, the molybdenum conductor layer 214 is deposited directly on the metal cap layer 213 in the absence of an air break. Processes of this sort are also referred to as an in situ process. In some embodiments of in situ processing, the atomic layer deposition 130 process starts at operation 136, with exposure of the substrate to the molybdenum precursor.

In one or more embodiments, the molybdenum precursor comprises any suitable precursor known to the skilled artisan. The molybdenum precursors of one or more embodiments are volatile and thermally stable, and, thus, suitable for vapor deposition. In some embodiments, the molybdenum precursor comprises a molybdenum halide.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—). Accordingly, as used herein, the term "molybdenum halide" refers to any coordination complex of molybdenum with one or more halogen or halide ligand. The term molybdenum halide includes molybdenum mixed halides which have at least two different halide atoms.

In one or more embodiments, the molybdenum halide is selected from one or more of molybdenum chloride, molybdenum pentachloride, molybdenum bromide, molybdenum iodide, molybdenum bromochloride, molybdenum bromoiodide, molybdenum chlorobromide, molybdenum chloroiodide, molybdenum iodobromide, molybdenum iodochloride.

In some embodiments, the molybdenum precursor comprises a molybdenum oxyhalide species. In some embodiments, the molybdenum oxyhalide species comprises one or more of molybdenum tetrachloride oxide ($MoCl_4O$), molybdenum tetrabromide oxide ($MoBr_4O$), molybdenum tetraiodide oxide ($MoI_4O$), molybdenum dibromide dioxide ($MoO_2Br_2$), molybdenum dichloride dioxide ($MoCl_2O_2$), and/or molybdenum diiodide dioxide ($MoI_2O_2$).

In one or more specific embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), tetrakis(dimethylamino)molybdenum(IV), and bis(tert-butylimido)-bis(dimethylamido)molybdenum.

In some embodiments, the substrate 202 (or substrate surface) is exposed to the molybdenum precursor at a temperature in a range of from 350° C. to 550° C., from 400° C. to 550° C., from 450° C. to 550° C., 500° C. to 550° C., from 350° C. to 500° C., from 400° C. to 500° C., from 450° C. to 500° C., from 350° C. to 450° C., from 400° C. to 450° C. or from 350° C. to 400° C.

In some embodiments, the substrate 202 (or substrate surface) is exposed to the molybdenum precursor for a duration of time in a range of from 0.25 seconds to 20 minutes, from 10 seconds to 20 minutes, from 1 minutes to 20 minutes, from 5 minutes to 20 minutes, from 10 minutes to 20 minutes, from 0.25 seconds to 10 minutes, from 10 seconds to 10 minutes, from 1 minutes to 10 minutes, from 5 minutes to 10 minutes, from 0.25 seconds to 5 minutes, from 10 seconds to 5 minutes, from 1 minutes to 5 minutes, from 0.25 seconds to 1 minutes or from 10 seconds to 1 min.

In some embodiments, the substrate 202 (or substrate surface) is exposed to the molybdenum precursor at a dose in a range of from 50 sccm to 700 sccm, from 100 sccm to 700 sccm, from 300 sccm to 700 sccm, from 500 sccm to 700 sccm, from 50 sccm to 500 sccm, from 100 sccm to 500 sccm, from 300 sccm to 500 sccm, from 50 sccm to 300 sccm, from 100 sccm to 300 sccm or from 50 sccm to 100 sccm.

In some embodiments, the substrate 202 (or substrate surface) is exposed to the molybdenum precursor at a pressure in a range of from 5 Torr to 50 Torr, from 10 Torr to 50 Torr, from 25 Torr to 50 Torr, from 5 Torr to 25 Torr, from 10 Torr to 25 Torr or from 5 Torr to 10 Torr.

In some embodiments, the molybdenum conductor layer 214 formed comprises elemental molybdenum. In some embodiments, the molybdenum conductor layer 214 consists essentially of molybdenum. As used in this manner, the term "consists essentially of molybdenum" means that the content of molybdenum in the film is greater than or equal to about 80%, 85%, 90%, 95%, 98%, 99% or 99.5% molybdenum, in atomic percent. Measurements of the composition of the molybdenum conductor layer 214 refer to the bulk portion of the molybdenum conductor layer 214, excluding interface regions where diffusion of elements from adjacent films may occur.

The deposition operation 130 can be repeated to deposit a molybdenum conductor layer 214, having a predetermined thickness. In some embodiments, the thickness $T_1$ of the molybdenum conductor layer 214 is controlled. In some embodiments, referring to FIG. 6, the thickness $T_1$ of the molybdenum conductor layer 214 is controlled relative to the depth $D_1$ of the plurality of trenches 204. In some embodiments, the thickness $T_1$ is greater than or equal to about 90% of the depth $D_1$ of the plurality of trenches 204.

Figure 7:
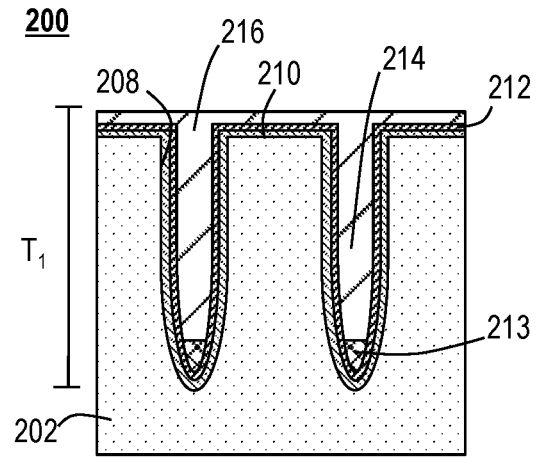
FIG. 7 is a cross-section view of a device according to one or more embodiments.

Referring to FIG. 7, in some embodiments, the thickness $T_1$ of the molybdenum conductor layer 214 is in excess of the depth $D_1$ of the trench 204, and an overburden of the molybdenum conductor layer 214 may be formed on the substrate. In some embodiments, the deposition operation 130 is repeated to provide a molybdenum conductor layer 214 having a thickness in the range of from 1 nm to 50 nm, from 5 nm to 50 nm, from 10 nm to 50 nm, from 25 nm to 50 nm, from 1 nm to 25 nm, from 5 nm to 25 nm, from 10 nm to 25 nm, from 1 nm to 10 nm, from 5 nm to 10 nm or from 1 nm to 5 nm.

In some embodiments, the molybdenum precursor further comprises a co-reactant. In some embodiments, the co-reactant is a reducing agent. In some embodiments, the co-reactant is hydrogen ($H_2$).

In some embodiments, the molybdenum precursor is used to pretreat the metal cap layer 213 before depositing the molybdenum conductor layer 214. In some embodiments, the pretreat comprises etching. In some embodiments, the etching is performed for a time duration in a range of from 5 seconds to 20 minutes, from 10 seconds to 20 minutes, from 1 minutes to 20 minutes, from 5 minutes to 20 minutes, from 10 minutes to 20 minutes, from 5 seconds to 10 minutes, from 10 seconds to 10 minutes, from 1 minutes to 10 minutes, from 5 minutes to 10 minutes, from 5 seconds to 5 minutes, from 10 seconds to 5 minutes, from 1 minutes to 5 minutes, from 5 seconds to 1 minutes or from 10 seconds to 1 min. In some embodiments, the etching is performed by the molybdenum precursor at a dose in a range of from 5 sccm to 700 sccm, from 50 sccm to 700 sccm, from 100 sccm to 700 sccm, from 300 sccm to 700 sccm, from 5 sccm to 500 sccm, from 50 sccm to 500 sccm, from 100 sccm to 500 sccm, from 300 sccm to 500 sccm, from 5 sccm to 300 sccm, from 50 sccm to 300 sccm, from 100 sccm to 300 sccm, from 5 sccm to 100 sccm, from 50 sccm to 100 sccm or from 5 sccm to 50 sccm.

Referring to FIG. 1, at operation 138, the processing chamber is optionally purged to remove unreacted molybdenum precursor, reaction products, and by-products. Purging the processing chamber in operation 138 can be the same process or different process than the purge in operation 134. Purging the processing chamber, portion of the processing chamber, area adjacent the substrate surface, etc., removes unreacted molybdenum precursor, reaction products and by-products from the area adjacent the substrate surface.

In the embodiment illustrated in FIG. 1, at deposition operation 130, the substrate (or substrate surface) 202 is exposed to the reactant and the molybdenum precursor sequentially. In some embodiments, the substrate (or substrate surface) is exposed to the molybdenum precursor first, followed by exposure to the reactant second. In other embodiments, the substrate (or substrate surface) is exposed to the reactant first, followed by exposure to the molybdenum precursor second. In another, un-illustrated, embodiment, the substrate (or substrate surface) is exposed to the molybdenum precursor and the reactant substantially simultaneously.

In some embodiments, the molybdenum conductor layer 214 is formed inside the feature 204 on the third surface 270 of the metal cap layer 213. The molybdenum conductor layer 214 of some embodiments fills the gap formed by the feature in a bottom-up manner. As used in this manner, "bottom-up" means that the deposition occurs substantially on the bottom of the feature relative to the sidewalls.

At decision 140, the thickness of the molybdenum conductor layer 214 is considered. If the molybdenum conductor layer 214 has reached a predetermined thickness, the method 100 moves to an optional post-processing operation 150. If the thickness of the molybdenum conductor layer 214 or the number of process cycles has not reached the predetermined threshold, the method 100 returns to operation 130 and continuing.

The optional post-processing operation 150 can be, for example, a process to modify film properties (e.g., annealing) or a further film deposition process (e.g., additional ALD or CVD processes) to grow additional films. In some embodiments, the optional post-processing operation 150 can be a process that modifies a property of the deposited film. In some embodiments, the optional post-processing operation 150 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). In other embodiments, the plasma is a microwave plasma. Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

Figure 8:
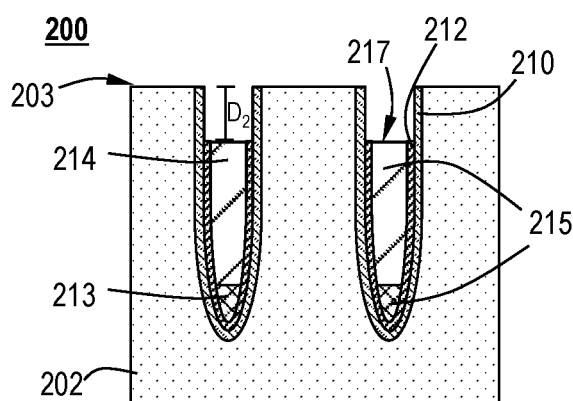
FIG. 8 is a cross-section view of a device according to one or more embodiments.

Referring to FIG. 8, in some embodiments, the molybdenum conductor layer 214 is recessed (buried) by chemical mechanical polishing (CMP) and an etch back such that the molybdenum conductor layer 214 and the work-function metal layer 212 do not protrude beyond the substrate surface 203 (e.g., so that the molybdenum conductor layer 214 is completely buried within the substrate 202).

In one or more embodiments, a buried word line 215 (i.e., the recessed molybdenum conductor layer 214) may be formed. In some embodiments, as illustrated in FIG. 8, the work-function metal layer 212 is recessed to the same level as the buried word line 215. A top surface 217 of the buried word line 215 and the work-function metal layer 212 is a recess depth or distance $D_2$ from the substrate surface 203 in the plurality of trenches 204.

After formation of the buried word line 215, processing of the substrate can continue to form a memory device. Such processes are known by the skilled artisan.

In one or more embodiments, the method comprises: depositing a metal cap layer in the feature of a substrate in a first processing chamber; moving the substrate to a second processing chamber that is integrated with the first processing chamber such that there is not an air break between the first and second processing chambers; and depositing a molybdenum conductor layer on the metal cap layer. In one or more embodiments, the method comprises: depositing a metal cap layer in the feature of a substrate in a first processing chamber; moving the substrate to a second processing chamber that is integrated with the first processing chamber such that there is not an air break between the first and second processing chambers; exposing the metal cap layer to a reactant; moving the substrate to a third processing chamber that is integrated with the second processing chamber such that there is not an air break between the second and third processing chambers; and depositing a molybdenum conductor layer on the reducing agent treated metal cap layer.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom and a second material at the sidewalls. In some embodiments, the metal cap layer deposit selectively on the first material relative to the second material so that the metal cap layer fills the feature in a bottom-up manner. In some embodiments, the molybdenum conductor layer deposit selectively on the first material relative to the second material so that the molybdenum conductor layer fills the feature in a bottom-up manner.

According to one or more embodiments, the substrate may be subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a buried word line, the method comprising:
depositing a metal cap layer on a substrate by one or more DC or RF physical vapor deposition (PVD), wherein the substrate is exposed to a metal precursor comprising tungsten or molybdenum at a direct current power in a range of from 20 kW to 60 kW or at a radio frequency power in a range of from 1 kW to 10 kW, and a bias in a range of from greater than 0 to 1200 W; and depositing a molybdenum conductor layer by a thermal atomic layer deposition on the metal cap layer, wherein the metal cap layer is exposed to a molybdenum precursor.

2. The method of claim 1, wherein the metal cap layer comprises one or more of tungsten or molybdenum.

3. The method of claim 1, wherein the metal cap layer is deposited at a temperature in a range of 200° C. to 450° C.

4. The method of claim 1, wherein the metal cap layer is deposited to a thickness in a range of from 10 Å to 200 Å.

5. The method of claim 1, wherein the molybdenum conductor layer is deposited selectively on the metal cap layer.

6. The method of claim 1, wherein the ALD process comprises exposing the substrate sequentially to a reactant and a molybdenum precursor.

7. The method of claim 6, wherein the molybdenum precursor comprises a molybdenum halide or molybdenum oxyhalide.

8. The method of claim 7, wherein the molybdenum precursor comprises one or more of molybdenum pentachloride or molybdenum dichloride dioxide.

9. The method of claim 6, wherein the reactant comprises hydrogen ($H_2$).

10. The method of claim 1, wherein the molybdenum conductor layer is deposited to a thickness in a range of from 1 nm to 50 nm.

11. The method of claim 1, wherein the ALD process occurs at a temperature in a range of 350° C. to 500° C.

12. The method of claim 1, wherein the buried word line has a resistance less than or equal to 20 μΩ-cm at a total thickness of 100 Å.

13. A method of forming a buried word line, the method comprising:
depositing a metal cap layer on a substrate by RF physical vapor deposition (PVD), wherein the substrate is exposed to a metal precursor comprising tungsten or molybdenum at a radio frequency power in a range of from 1 kW to 10 kW, with a bias in a range of from greater that 0 W to 1200 W; and
depositing a molybdenum conductor layer by a thermal atomic layer deposition on the metal cap layer, wherein the metal cap layer is exposed to the molybdenum precursor.

14. The method of claim 13, wherein the metal cap layer comprises one or more of tungsten or molybdenum.

15. The method of claim 13, wherein the metal cap layer is deposited to a thickness in a range of from 10 Å to 200 Å.

16. The method of claim 13, wherein the molybdenum conductor layer is deposited to a thickness in a range of from 1 nm to 50 nm.

17. A method of forming a buried word line, the method comprising:
depositing a metal cap layer on a substrate by DC physical vapor deposition (PVD), wherein the substrate is exposed to a metal precursor comprising molybdenum at a DC power in a range of from 20 kW to 60 kW, with a bias in a range of from greater than 0 W to 1200 W; and
depositing a molybdenum conductor layer by a thermal atomic layer deposition on the metal cap layer, wherein the metal cap layer is exposed to the molybdenum precursor.

18. The method of claim 17, wherein the metal cap layer comprises one or more of tungsten or molybdenum.

19. The method of claim 17, wherein the metal cap layer is deposited to a thickness in a range of from 10 Å to 200 Å.

20. The method of claim 17, wherein the molybdenum conductor layer is deposited to a thickness in a range of from 1 nm to 50 nm.

* * * * *